(12) United States Patent
Chang et al.

(10) Patent No.: US 9,870,997 B2
(45) Date of Patent: Jan. 16, 2018

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Chih-Hao Chang, Hsinchu County (TW); Hsin-Hung Liao, Taipei (TW); Hao-Yi Tsai, Hsinchu (TW); Chien-Ling Hwang, Hsinchu (TW); Wei-Sen Chang, Kinmen County (TW); Tsung-Hsien Chiang, Hsinchu (TW); Tin-Hao Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/270,008

(22) Filed: Sep. 20, 2016

(65) Prior Publication Data

US 2017/0345764 A1    Nov. 30, 2017

Related U.S. Application Data

(60) Provisional application No. 62/340,535, filed on May 24, 2016.

(51) Int. Cl.
*H01L 21/44* (2006.01)
*H01L 23/538* (2006.01)
(Continued)

(52) U.S. Cl.
CPC ........ *H01L 23/5389* (2013.01); *H01L 21/568* (2013.01); *H01L 21/6835* (2013.01);
(Continued)

(58) Field of Classification Search
CPC ............... H01L 21/568; H01L 21/6835; H01L 21/76885; H01L 23/5389
(Continued)

(56) References Cited

U.S. PATENT DOCUMENTS 7,276,783 B2 * 10/2007 Goller .................... H01L 21/56
257/678
8,164,171 B2 * 4/2012 Lin .................. H01L 23/49816
257/685

(Continued)

*Primary Examiner* — Nitin Parekh
(74) *Attorney, Agent, or Firm* — JCIPRNET

(57) ABSTRACT

A method for fabricating an integrated fan-out package is provided. The method includes the following steps. A plurality of conductive posts are placed in apertures of a substrate. A carrier having an adhesive thereon is provided. The conductive posts are transferred to the carrier in a standing orientation by adhering the conductive posts in the apertures to the adhesive. An integrated circuit component is mounted onto the adhesive having the conductive posts adhered thereon. An insulating encapsulation is formed to encapsulate the integrated circuit component and the conductive posts. A redistribution circuit structure is formed on the insulating encapsulation, the integrated circuit component, and the conductive posts, wherein the redistribution circuit structure is electrically connected to the integrated circuit component and the conductive posts. The carrier is removed. At least parts of the adhesive are removed (e.g. patterned or entirely removed) to expose surfaces of the conductive posts. A plurality of conductive terminals are formed on the surfaces of the conductive posts exposed by the openings.

20 Claims, 17 Drawing Sheets

(51) Int. Cl.
*H01L 21/56* (2006.01)
*H01L 21/683* (2006.01)
*H01L 21/768* (2006.01)
*H01L 23/00* (2006.01)
*H01L 23/31* (2006.01)

(52) U.S. Cl.
CPC .... *H01L 21/76885* (2013.01); *H01L 23/3107* (2013.01); *H01L 23/5384* (2013.01); *H01L 24/19* (2013.01); *H01L 24/20* (2013.01); *H01L 2221/68345* (2013.01); *H01L 2221/68359* (2013.01); *H01L 2924/01029* (2013.01); *H01L 2924/14* (2013.01); *H01L 2924/2064* (2013.01)

(58) Field of Classification Search
USPC .................................. 438/118, 121, 124–127
See application file for complete search history.

(56) References Cited

U.S. PATENT DOCUMENTS

| | | | |
|---|---|---|---|
| 8,361,842 B2 | 1/2013 | Yu et al. | |
| 8,669,137 B2 * | 3/2014 | Nah | H01L 21/563 257/E21.502 |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,040,316 B1 * | 5/2015 | Scanlan | H01L 21/76879 438/15 |
| 2007/0126127 A1 * | 6/2007 | Jobetto | H01L 21/568 257/780 |
| 2007/0275507 A1 * | 11/2007 | Muraki | B29C 33/10 438/127 |
| 2009/0263938 A1 * | 10/2009 | Ino | H01L 21/4846 438/124 |
| 2010/0052164 A1 * | 3/2010 | Lee | H01L 23/3114 257/738 |
| 2011/0057325 A1 * | 3/2011 | Ishihara | H01L 23/3114 257/774 |
| 2011/0291288 A1 | 12/2011 | Wu et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2016/0133537 A1 * | 5/2016 | Shih | H01L 24/83 257/762 |
| 2016/0233196 A1 * | 8/2016 | Kim | H01L 25/0657 |
| 2016/0260682 A1 * | 9/2016 | Scanlan | H01L 21/78 |

* cited by examiner

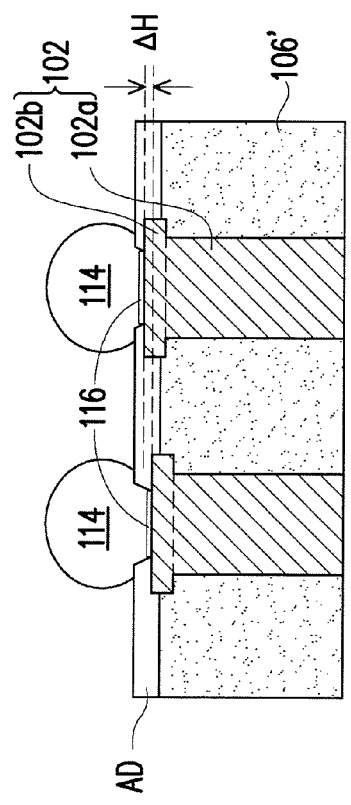
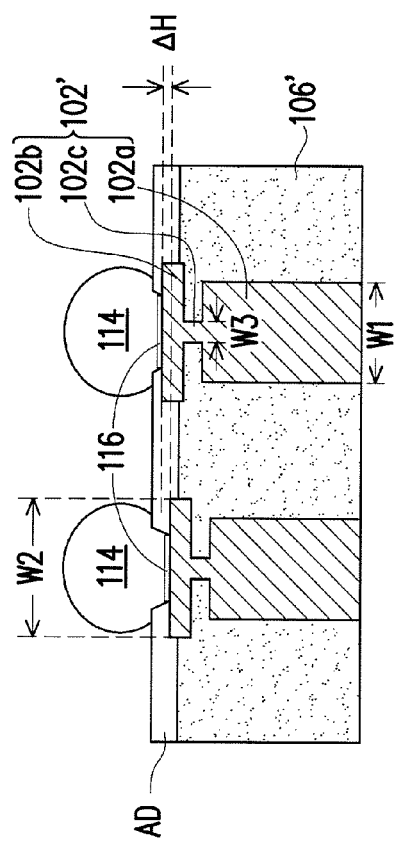
FIG. 11A
FIG. 11B

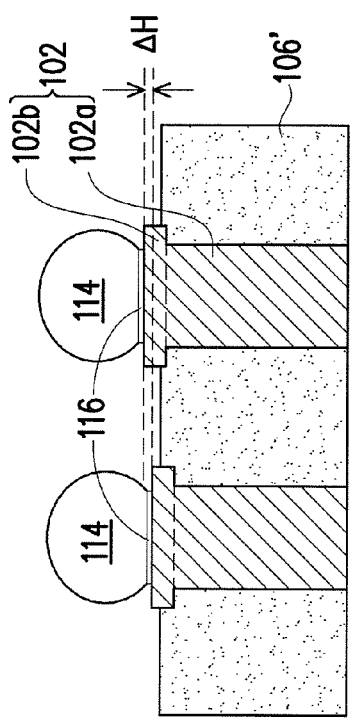
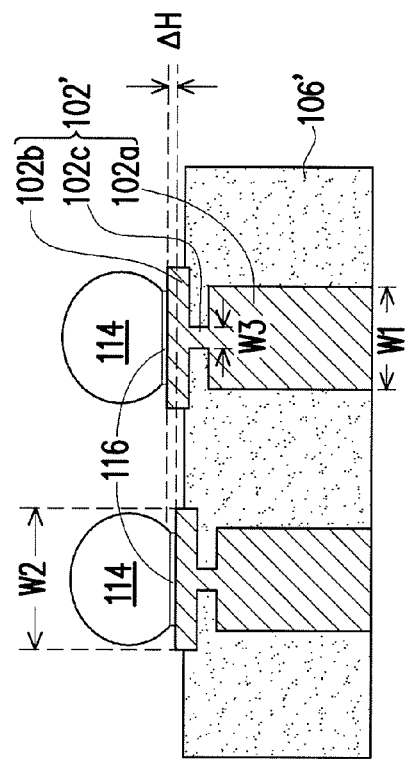

INTEGRATED FAN-OUT PACKAGE AND METHOD OF FABRICATING THE SAME

CROSS-REFERENCE TO RELATED APPLICATION

This application claims the priority benefits of U.S. provisional application Ser. No. 62/340,535, filed on May 24, 2016. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. How to reduce fabrication costs of the integrated fan-out packages is an important issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A through 11C are cross-sectional views illustrating different conductive posts in accordance with some embodiments.

FIGS. 1 through 7 and FIGS. 12 through 13 illustrate another process flow for fabricating an integrated fan-out package in accordance with some embodiments.

FIGS. 15A through 15C are cross-sectional views illustrating different conductive posts in accordance with some alternative embodiments.

DETAILED DESCRIPTION

Figure 1:
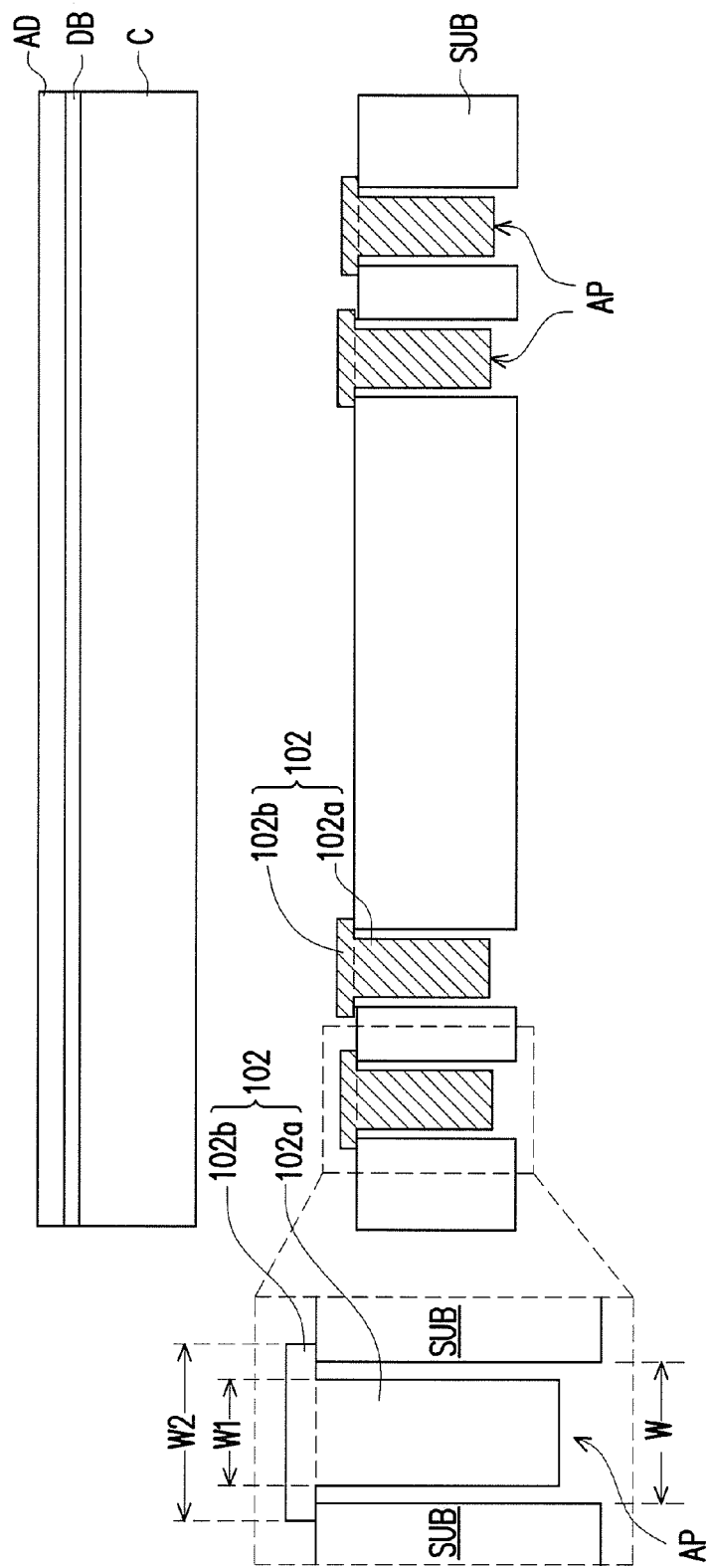
FIGS. 1 through 9 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 9 illustrate a process flow for fabricating an integrated fan-out package in accordance with some embodiments. Referring to FIG. 1, a substrate SUB having a plurality of apertures AP arranged in an array and a carrier C having a de-bonding layer DB and an adhesive AD stacked thereon are provided. In some embodiments, the substrate SUB is a stencil, the de-bonding layer DB is formed on the upper surface of the carrier C, and the de-bonding layer DB is between the carrier C and the adhesive AD. For example, the carrier C is a glass substrate, and the de-bonding layer DB is a light-to-heat conversion (LTHC) release layer formed on the glass substrate. However, the materials of the de-bonding layer DB and the carrier C are merely for illustration, and the disclosure is not limited thereto.

As shown in FIG. 1, a plurality of pre-fabricated conductive posts 102 are provided and placed in the apertures AP of the substrate SUB. In some embodiments, the pre-fabricated conductive posts 102 (e.g., copper posts or other suitable metal posts) are provided on the substrate SUB and the conductive posts 102 are, for example, vibrated by a vibration machine such that the conductive posts 102 can be partially inserted into the apertures AP of the substrate SUB. Through proper vibration controls (vibration frequency and/or vibration magnitude) of the vibration machine, the substrate SUB is vibrated and the pre-fabricated conductive posts 102 having substantially identical height can be driven to move on the substrate SUB and can be driven to fall into the apertures AP of the substrate SUB successfully. Since the conductive posts 102 are pre-fabricated, the conductive posts 102 with a pre-determined aspect ratio, especially high aspect ratio (e.g., the aspect ratio greater than 1:3), can be easily fabricated. Furthermore, the fabrication costs and the fabrication cycle time of the conductive posts 102 are reduced, since the conductive posts 102 are not fabricated by sputtering, photolithography, plating, and photoresist stripping processes. In some embodiments, the height of the pre-fabricated conductive posts 102 may range from 100 micrometers to 300 micrometers, and the width of the pre-fabricated conductive posts 102 may range from 150 micrometers to 300 micrometers. In some alternative embodiments, the height of the pre-fabricated conductive posts 102 may range from 100 micrometers to 500 micrometers, and the width of the pre-fabricated conductive posts 102 may range from 150 micrometers to 300 micrometers.

In some embodiments, each of the conductive posts 102 includes a first portion 102a and a second portion 102b connected to the first portion 102a. The first portion 102a of the exemplary conductive post 102 is arranged to be inserted in one of the apertures AP of the substrate SUB, and the second portion 102b of the conductive post 102 is flanged and arranged to remain outside the apertures AP of the substrate SUB. The width W1 of the first portion 102a of the conductive post 102 is less than the width W of the apertures AP, and the width W2 of the second portion 102b is greater than the width W of the apertures AP. The second portion 102b of the conductive post 102 covers the apertures AP of the substrate SUB and partially covers the upper surface of the substrate SUB. The first portions 102a and the second portions 102b of the conductive posts 102 may be made from the same material or may be made from different materials.

In some embodiments, the conductive posts 102 may be pre-fabricated by straight cutting process. In some alternative embodiments, the conductive posts 102 may be pre-fabricated by straight cutting and heading process. The characteristics (e.g. width, height, shape, electrical conductivity, and so on) of the pre-fabricated conductive posts 102 may be inspected in advance. Accordingly, the yield rate of production of the conductive posts 102 can be increased. Since the conductive posts 102 are pre-fabricated, the height variation of the conductive posts 102 due to fabrication tolerance may be easier to control with greater flexibility. In some embodiments, the height variation between the conductive posts 102 is greater than 1 micrometer and less than 10 micrometers.

Figure 2:
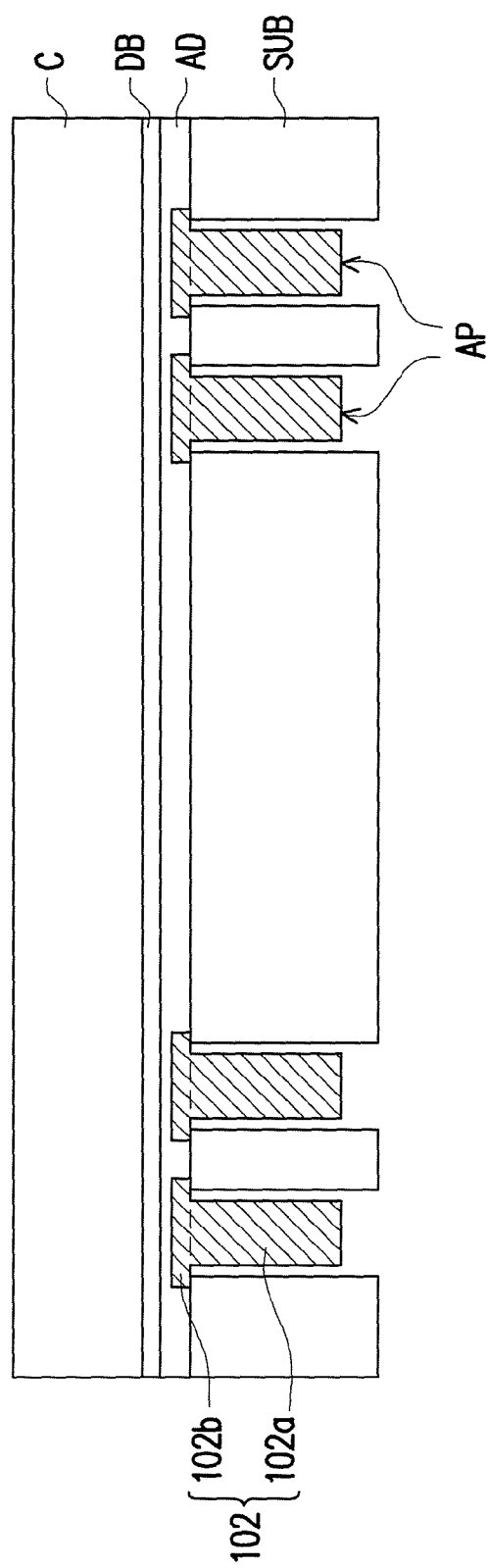

Referring to FIG. 2, the carrier C having a de-bonding layer DB and an adhesive AD stacked thereon is flipped onto and bonded with the substrate SUB such that the second portions 102b of the conductive posts 102 are adhered with the adhesive AD. When the adhesive AD is pressed onto and bonded with the second portions 102b of the conductive posts 102, the second portions 102b of the conductive posts 102 may be partially embedded in the adhesive AD.

As shown in FIG. 2, in some embodiments, when the carrier C having the de-bonding layer DB and the adhesive AD stacked thereon is flipped onto and bonded with the substrate SUB, the adhesive AD is adhered with the upper surface of the substrate SUB and the second portions 102b of the conductive posts 102. In some alternative embodiments, when the carrier C having the de-bonding layer DB and the adhesive AD stacked thereon is flipped onto and bonded with the second portions 102b of the conductive posts 102, the adhesive AD does not substantially contact (e.g., does not establish adherence with) the upper surface of the substrate SUB.

Figure 3:
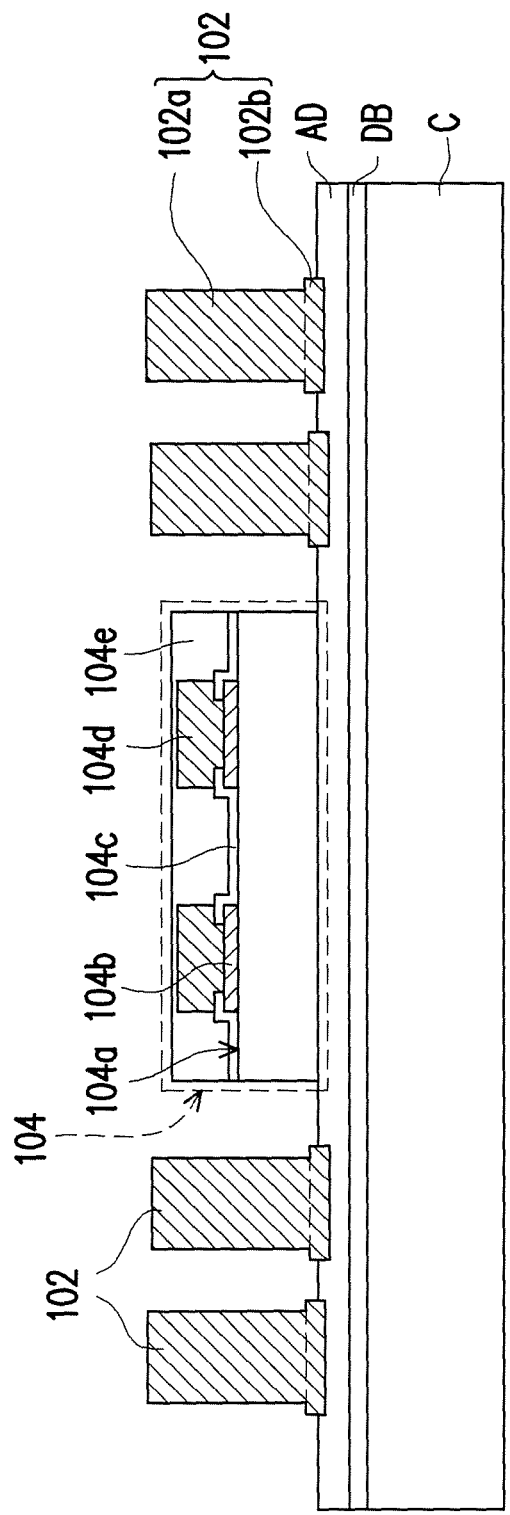

Referring to FIG. 2 and FIG. 3, after the adhesive AD is adhered to the second portions 102b of the conductive posts 102, the carrier C is driven to move upwardly to pull-out the conductive posts 102 from the apertures AP of the substrate SUB. The adhesive AD provides sufficient adhesion to pull-out the conductive posts 102 from the apertures AP of the substrate SUB such that the conductive posts 102 are transfer-bonded to the adhesive AD in a standing orientation.

Referring to FIG. 3, after the conductive posts 102 are transfer-bonded to the adhesive AD from the substrate SUB, the second portions 102b of the conductive posts 102 may be embedded in the adhesive AD, wherein the thickness of the adhesive AD ranges from about 3 micrometers to about 30 micrometers, and the embedded depth of the second portions 102b may ranges from about 1 micrometer to about 10 micrometers. In some embodiments, the variation of the embedded depth of the second portions 102b may be greater than 1 micrometer and less than 10 micrometers. When the conductive posts 102 are transfer-bonded to and embedded in the adhesive AD, the level (height) variation ΔH (shown in the enlarged portions of FIG. 11A through FIG. 11C) between bottom surfaces of the conductive posts 102 may be greater than 1 micrometer and less than 10 micrometers. Here, the level (height) variation ΔH is defined to be the difference between the lowest level (height) and the highest level (height) of the bottom surfaces of the conductive posts 102. Then, the carrier C having the de-bonding layer DB, the adhesive AD, and the conductive posts 102 thereon are flipped again for sequential processes.

As shown in FIG. 3, an integrated circuit component 104 is mounted onto the adhesive AD having the conductive posts 102 adhered thereon. The adhesive AD serves as a die attach film (DAF). The integrated circuit component 104 includes an active surface 104a, a plurality of pads 104b distributed on the active surface 104a, a passivation layer 104c covering the active surface 104a, a plurality of conductive pillars 104d, and a protection layer 104e. The pads 104b are partially exposed by the passivation layer 104c, the conductive pillars 104d are disposed on and electrically connected to the pads 104b, and the protection layer 104e covers the conductive pillars 104d and the passivation layer 104c. The conductive pillars 104d are copper pillars or other suitable metal pillars, for example. In some embodiments, the protection layer 104e may be a polybenzoxazole (PBO) layer, a polyimide (PI) layer or other suitable polymers. In some alternative embodiments, the protection layer 104e may be made of inorganic materials.

In FIG. 3, one integrated circuit component 104 is mounted onto the adhesive AD. The number of the integrated circuit component 104 shown in the instant figures is merely for illustration, and the disclosure is not limited thereto. In some alternative embodiments, a plurality of integrated circuit components 104 are mounted onto the adhesive AD, and the integrated circuit components 104 placed on the adhesive AD may be arranged in an array. When the plurality of integrated circuit components 104 are mounted on the adhesive AD, a plurality of groups of the conductive posts 102 may be mounted on the adhesive AD and each of the integrated circuit components 104 is surrounded by one group of the conductive posts 102, respectively. The number of the integrated circuit components 104 is corresponding to the number of the groups of the conductive posts 102.

As shown in FIG. 3, the top surface of the integrated circuit component 104 is lower than the top surfaces of the conductive posts 102. However, the disclosure is not limited thereto. In some alternative embodiments, the top surface of the integrated circuit component 104 may be substantially coplanar with the top surfaces of the conductive posts 102.

Figure 4:
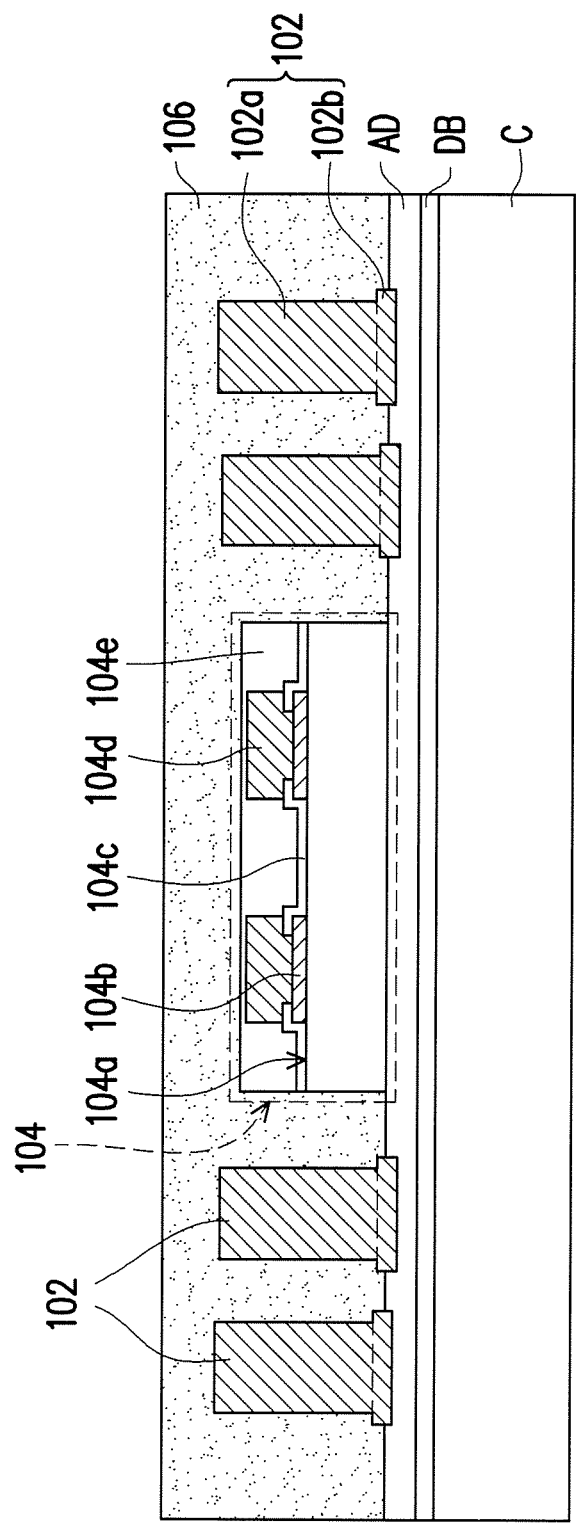

Referring to FIG. 4, an insulating material 106 is formed on the adhesive AD to encapsulate the conductive posts 102 and the integrated circuit component 104. In some embodiments, the insulating material 106 is a molding compound formed by a molding process. The conductive posts 102 and the protection layer 104e of the integrated circuit component 104 are encapsulated by the insulating material 106. In other words, the conductive posts 102 and the protection layer 104e of the integrated circuit component 104 are not revealed and are well protected by the insulating material 106. In some embodiments, the insulating material 106 may include epoxy or other suitable materials.

Figure 5:
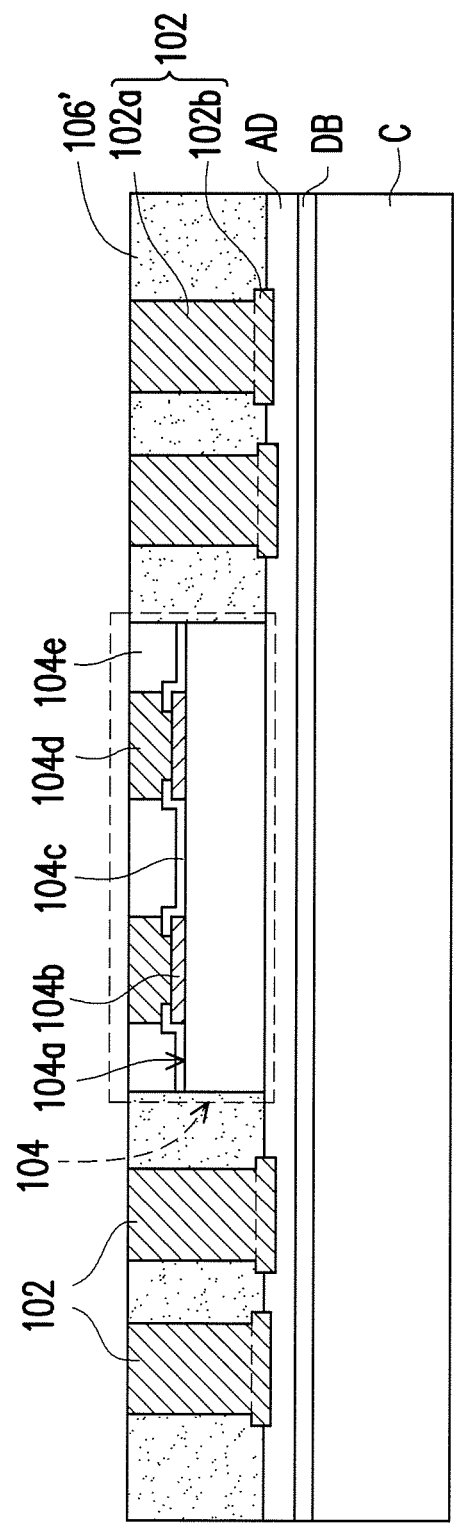

As shown in FIG. 5, the insulating material 106 and the protection layer 104e of the integrated circuit component 104 are grinded until the top surfaces of the conductive pillars 104d are exposed. After the insulating material 106 is grinded, an insulating encapsulation 106' is formed over the adhesive AD. During the above-mentioned grinding process, portions of the protection layer 104e are also grinded to form a protection layer 104e'. In some embodiments, during the above-mentioned grinding process of the insulating material 106 and the protection layer 104e, portions of the conductive pillars 104d and portions of the conductive posts 102 are grinded until the top surfaces of the conductive pillars 104d and the top surfaces of the conductive posts 102 are exposed. In some embodiments, the insulating encapsulation 106' may be formed by a mechanical grinding and/or a chemical mechanical polishing (CMP).

The insulating encapsulation 106' encapsulates the sidewalls of the integrated circuit component 104, and the insulating encapsulation 106' is penetrated by the conductive posts 102. In other words, the integrated circuit component 104 and the conductive posts 102 are embedded in the insulating encapsulation 106'. It is noted that the top surfaces of the conductive posts 102, the top surface of the protection layer 104e, and the top surfaces of the conductive pillar 104d are substantially coplanar with the top surface of the insulating encapsulation 106'.

Figure 6:
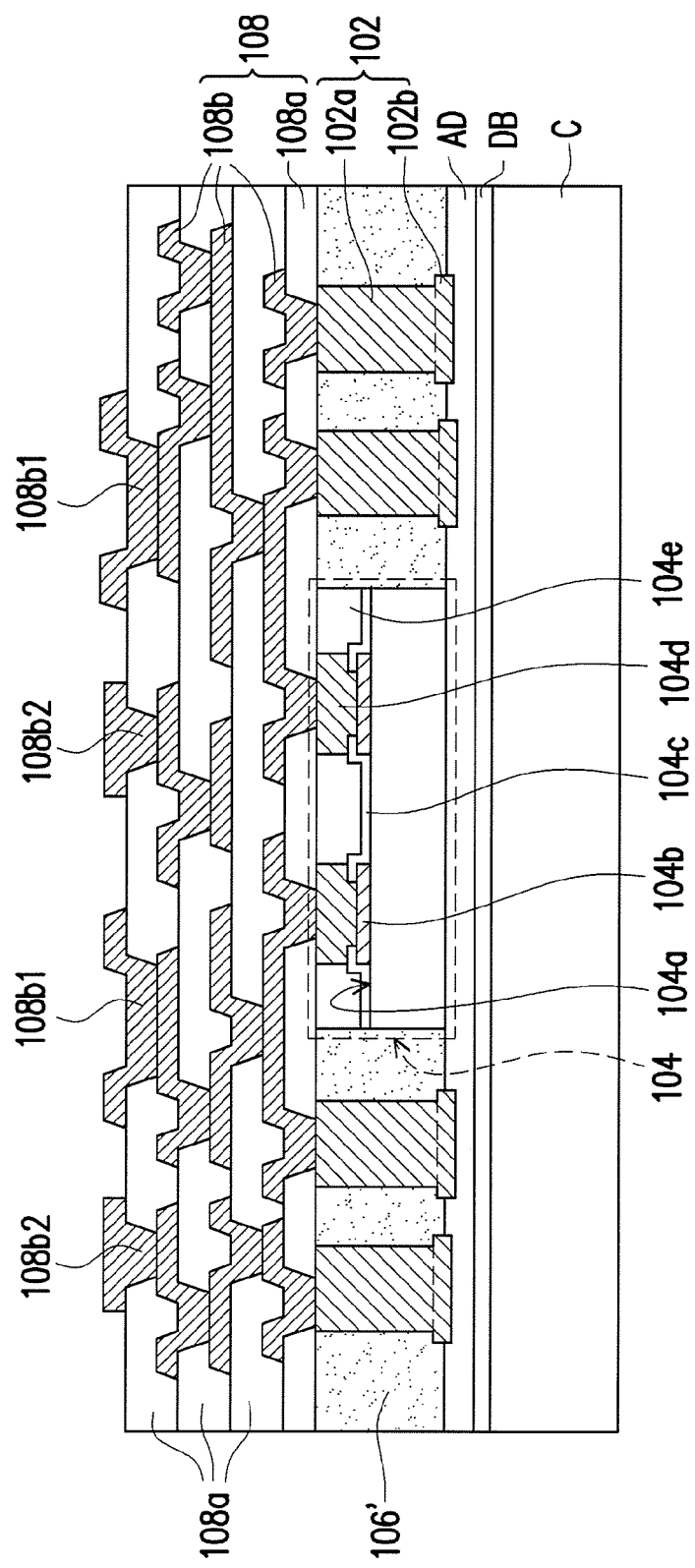

Referring to FIG. 6, after the insulating encapsulation 106' and the protection layer 104e' are formed, a redistribution circuit structure 108 electrically connected to the conductive pillars 104d of the integrated circuit component 104 and the conductive posts 102 is formed on the top surfaces of the conductive posts 102, the top surface of the insulating encapsulation 106', the top surfaces of the conductive pillars 104d, and the top surface of the protection layer 104e'. As shown in FIG. 6, the redistribution circuit structure 108 includes a plurality of inter-dielectric layers 108a and a plurality of redistribution conductive layers 108b stacked alternately. The redistribution conductive layers 108b are electrically connected to the conductive pillar 104e of the integrated circuit component 104 and the conductive posts 102 embedded in the insulating encapsulation 106'. In some embodiments, the top surfaces of the conductive pillars 104d and the top surfaces of the conductive posts 102 are in contact with the bottommost redistribution conductive layer 108b of the redistribution circuit structure 108. The top surfaces of the conductive pillars 104d and the top surfaces of the conductive posts 102 are partially covered by the bottommost inter-dielectric layer 108a. Furthermore, the topmost redistribution conductive layer 108b includes a plurality of pads. In some embodiment the above-mentioned pads include a plurality of under-ball metallurgy (UBM) patterns 108b1 for ball mount and/or at least one connection pads 108b2 for mounting of passive components. The number of the under-ball metallurgy patterns 180b1 and the connection pad 108b2 is not limited in this disclosure.

Figure 7:
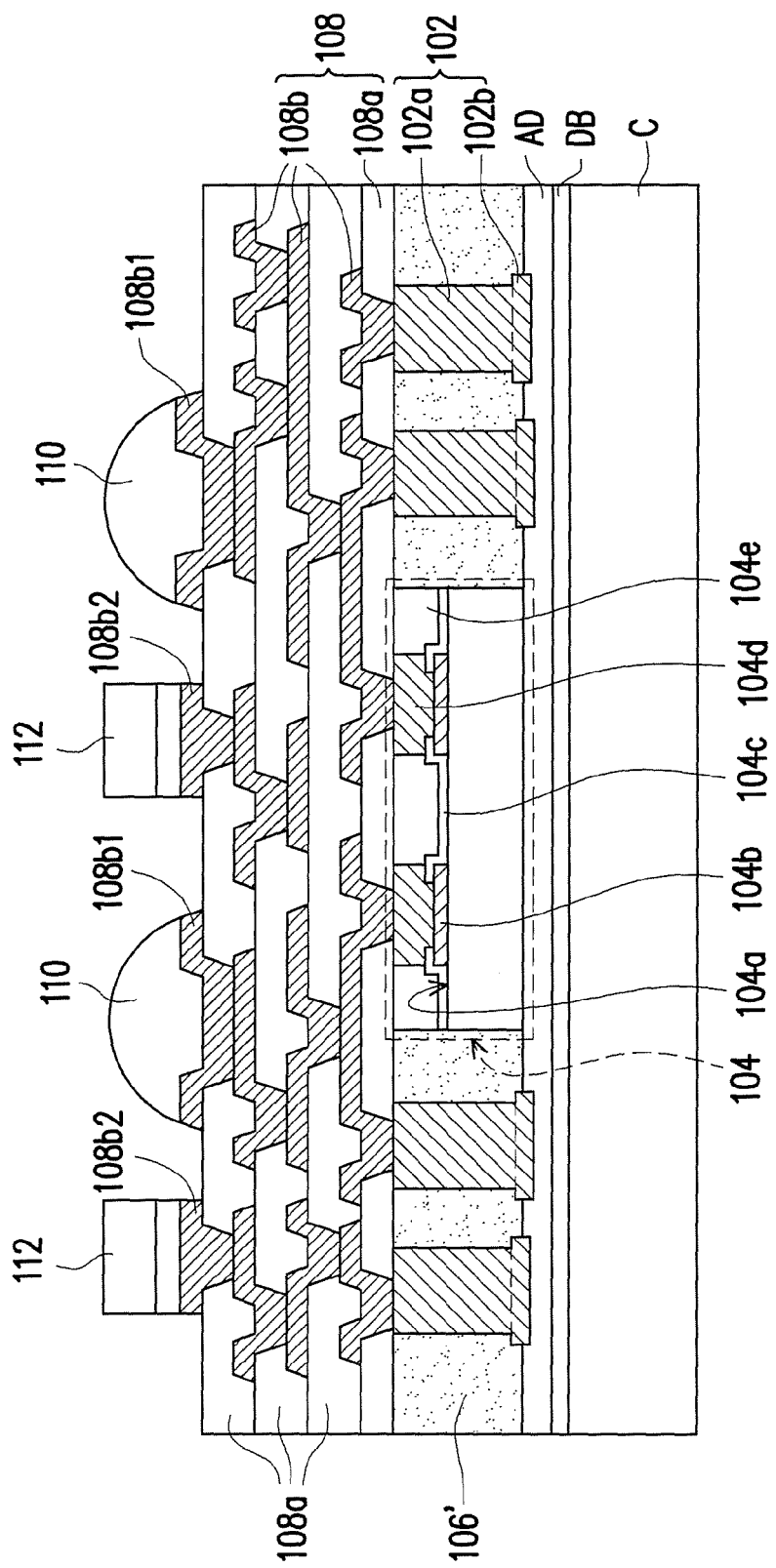

Referring to FIG. 7, after the redistribution circuit structure 108 is formed, a plurality of conductive terminals 110 are placed on the under-ball metallurgy patterns 108b1, and a plurality of passive components 112 are mounted on the connection pads 108b2. In some embodiments, the conductive terminals 110 may be placed on the under-ball metallurgy patterns 108b1 through a ball placement process and the passive components 112 may be mounted on the connection pads 108b2 through a soldering process or a reflowing process.

Figure 8:
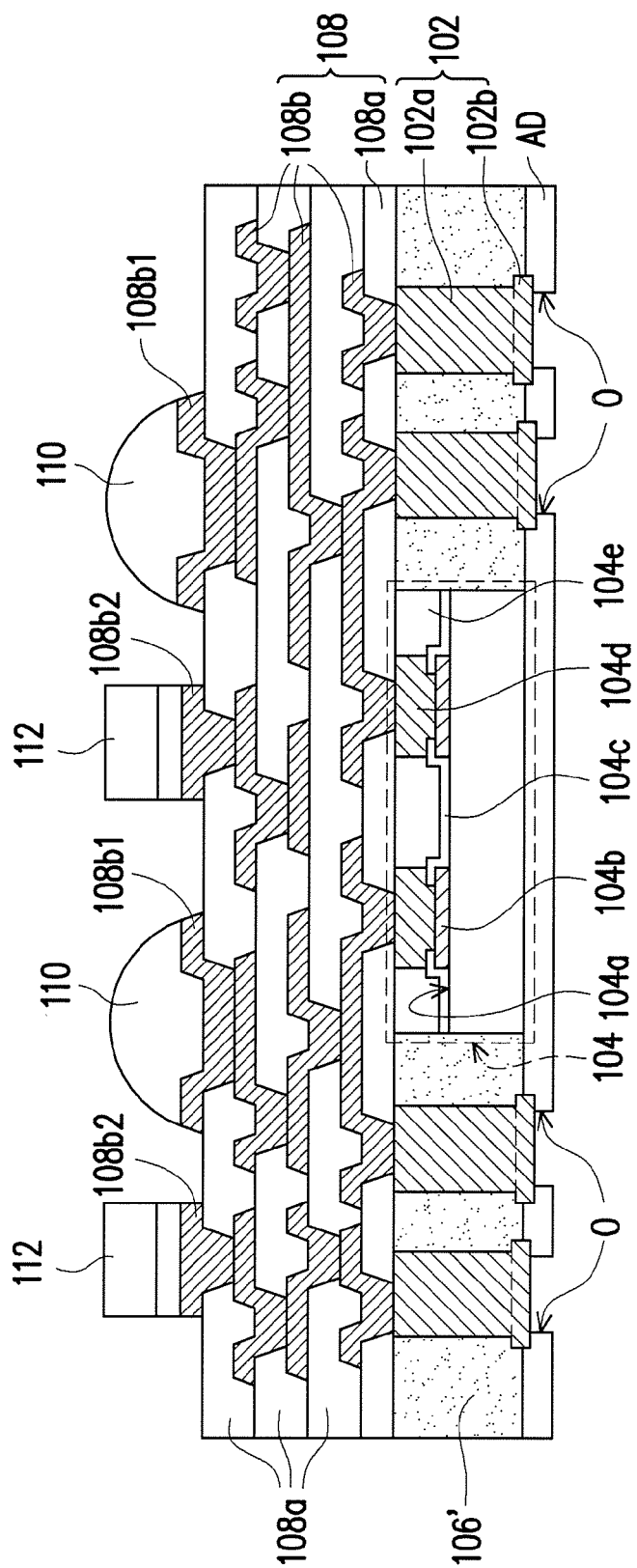

Referring to FIG. 8, after the conductive terminals 110 and the passive components 112 are mounted on the redistribution circuit structure 108, the adhesive AD formed on the bottom surface of the insulating encapsulation 106' is de-bonded from the de-bonding layer DB such the adhesive AD is separated from the carrier C. In some embodiments, the de-bonding layer DB (e.g., the LTHC release layer) may be irradiated by an UV laser such that the adhesive AD adhered on the bottom surface of the insulating encapsulation 106' is peeled from the carrier C. As shown in FIG. 8, the adhesive AD is then patterned such that a plurality of contact openings O is formed to partially expose the second portions 102b of the conductive posts 102. The number of the contact openings O is corresponding to the number of the conductive posts 102. In some embodiments, the contact openings O of the adhesive AD are formed by a laser drilling process.

Figure 9:
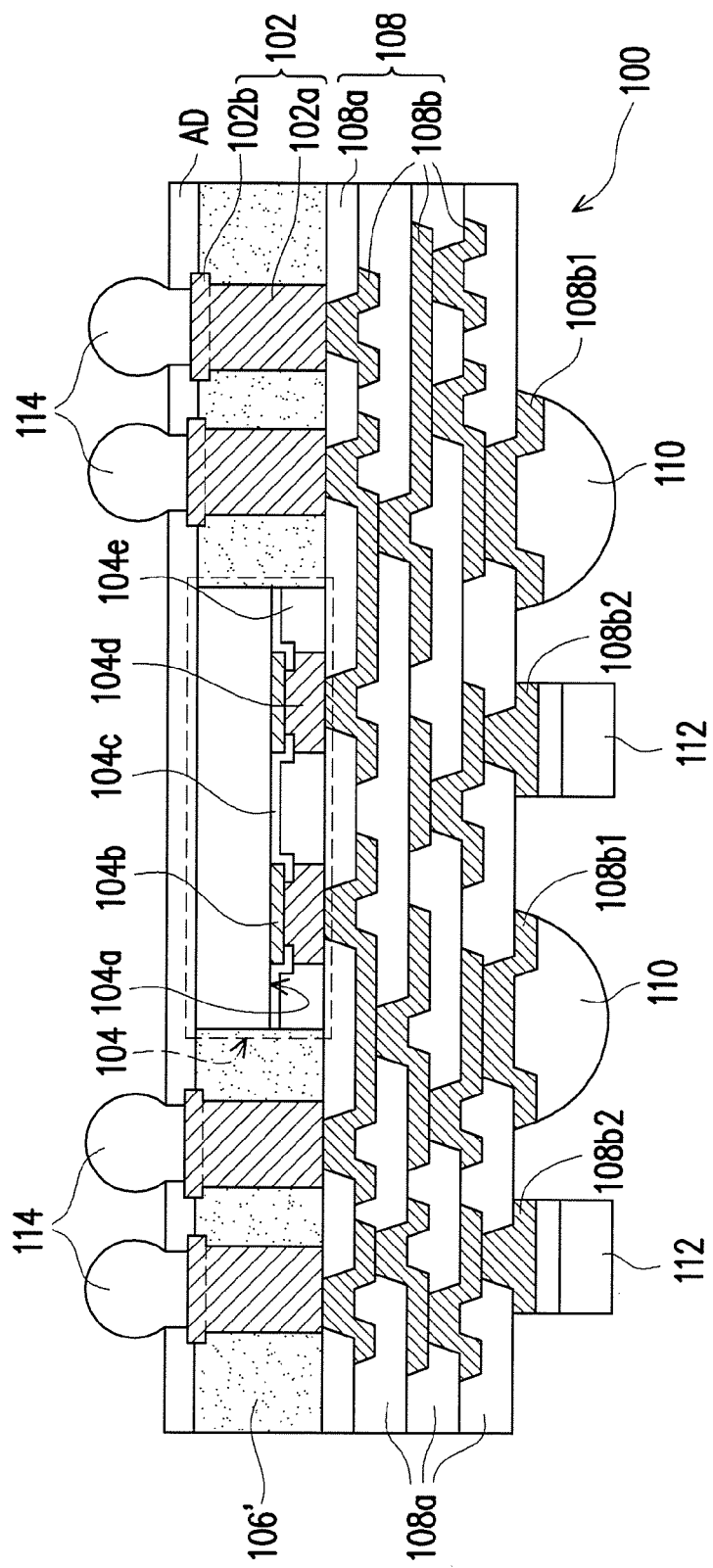

Referring to FIG. 9, after the contact openings O are formed in the adhesive AD, a plurality of conductive terminals 114 are placed in the contact openings O, and the conductive terminals 114 are electrically connected to the second portions 102b of the conductive posts 102. As shown in FIG. 9, after the conductive terminals 110 and the conductive terminals 114 are formed, an integrated fan-out package 100 having dual-side terminal design is accomplished.

Figure 10:
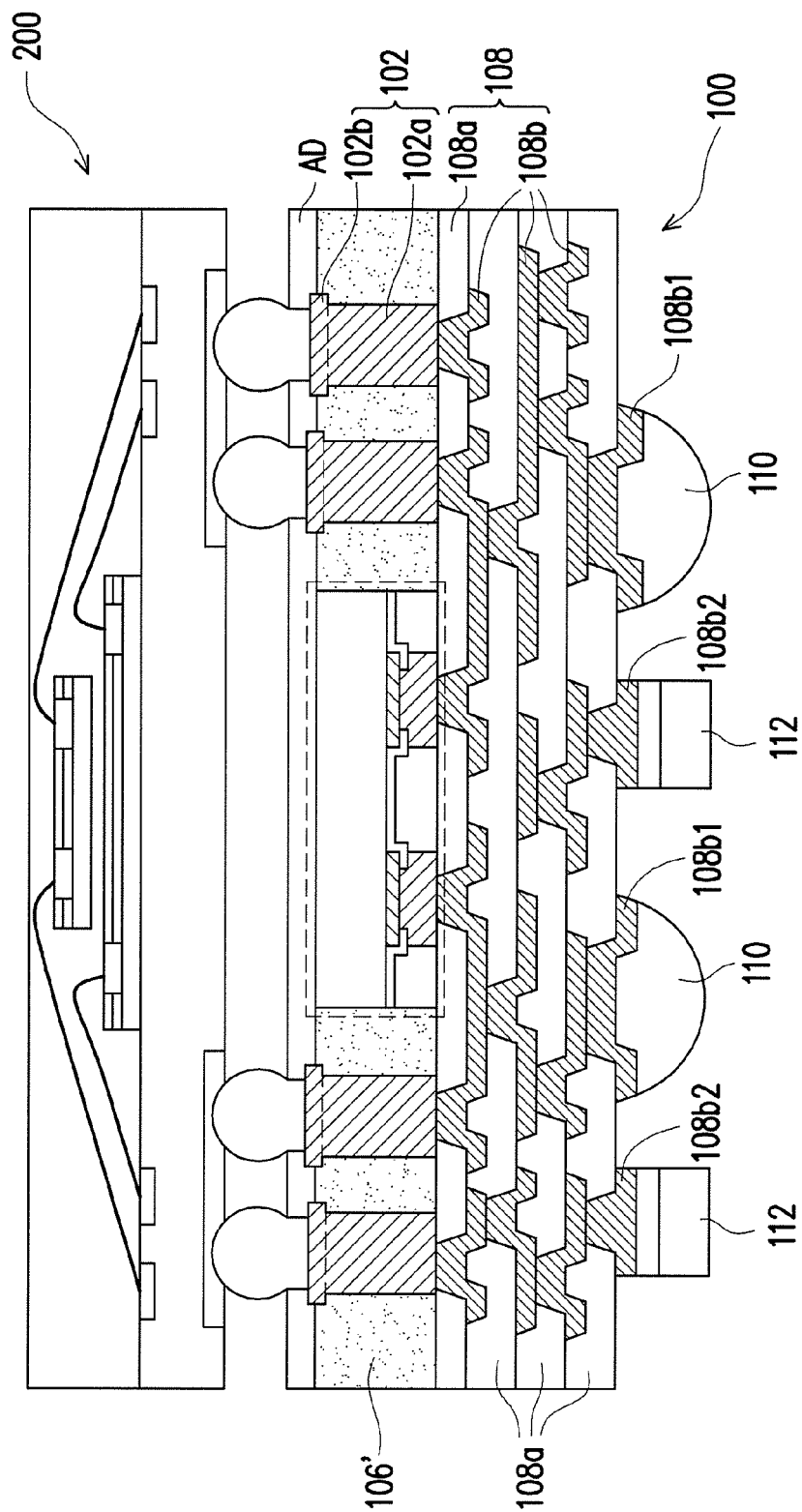
FIG. 10 is across-sectional view illustrating a package-on-package (POP) in accordance with some embodiments.

FIG. 10 is across-sectional view illustrating a package-on-package (POP) in accordance with some embodiments. Referring to FIG. 9 and FIG. 10, another package 200 is provided. In some embodiments, the package 200 is, for example, a memory device or other IC packages. The package 200 is stacked over and electrically connected to the integrated fan-out package 100 illustrated in FIG. 9 through the conductive balls 114 such that a package-on-package (POP) structure is fabricated.

Figure 11C:
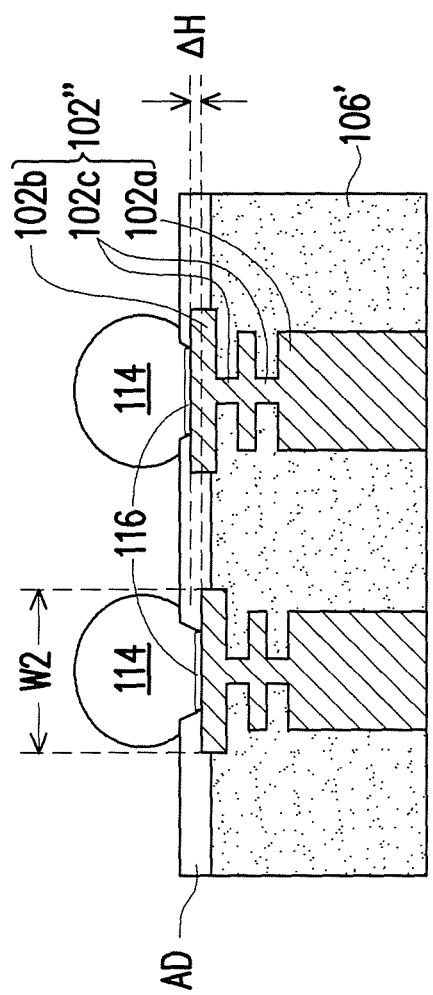

FIGS. 11A through 11C are cross-sectional views illustrating different conductive posts in accordance with some embodiments. Referring to FIG. 9 and FIG. 11A, in the integrated fan-out package 100 illustrated in FIG. 9, the second portions 102b of the conductive posts 102 and the conductive terminals 114 may be made from the same material or may be made from different materials.

In some embodiments, the second portions 102b of the conductive posts 102 and the conductive terminals 114 are made from the same material. In some embodiments, the interface between the conductive posts 102 and the conductive terminals 114 may be formed at different level/heights. As illustrated in FIG. 11A through FIG. 11C, the level (height) variation ΔH between the joining interfaces of various conductive posts 102 and the corresponding conductive terminals 114 is greater than 1 micrometer and less than 10 micrometers. In some alternative embodiments, the second portions 102b of the conductive posts 102 and the conductive terminals 114 are made from different materials, a plurality of intermetallic compound layers 116 located at different level/heights are formed between the conductive posts 102 and the conductive terminals 114, and the level (height) variation ΔH of the intermetallic compound layers 116 between the conductive posts 102 and the conductive terminals 114 may be greater than 1 micrometer and less than 10 micrometers, for example.

Referring to FIG. 11B, the conductive posts 102 shown in FIG. 11A may be modified into the conductive posts 102' according to design requirements. As shown in FIG. 11B, each of the conductive posts 102' includes a first portion 102a, a second portion 102a, and a necking portion 102c which is connected between the first portion 102a and the second portion 102b. The width W3 of the necking portion 102c is less than the width W1 of the first portion 102a and the width W2 of the second portion 102b. The first portions 102a and the necking portions 102c of the conductive posts 102' are embedded in and encapsulated by the insulating encapsulation 106'. The necking portions 102c of the conductive posts 102' may enhance the adhesion between the conductive posts 102' and the insulating encapsulation 106'.

Referring to FIG. 11C, the conductive posts 102 shown in FIG. 11A may be modified into the conductive posts 102" according to design requirements. As shown in FIG. 11C, each of the conductive posts 102" includes a first portion 102a, a second portion 102a, and two necking portions 102c which are connected between the first portion 102a and the second portion 102b. The necking portions 102c of the same conductive post 102 are connected to each other. The width W3 of the necking portion 102c is less than the width W1 of the first portion 102a and the width W2 of the second portion 102b. The necking portions 102c of the conductive posts 102" are embedded in and encapsulated by the insulating encapsulation 106'. The necking portions 102c of the conductive posts 102' may enhance the adhesion between the conductive posts 102" and the insulating encapsulation 106'.

Figure 12:
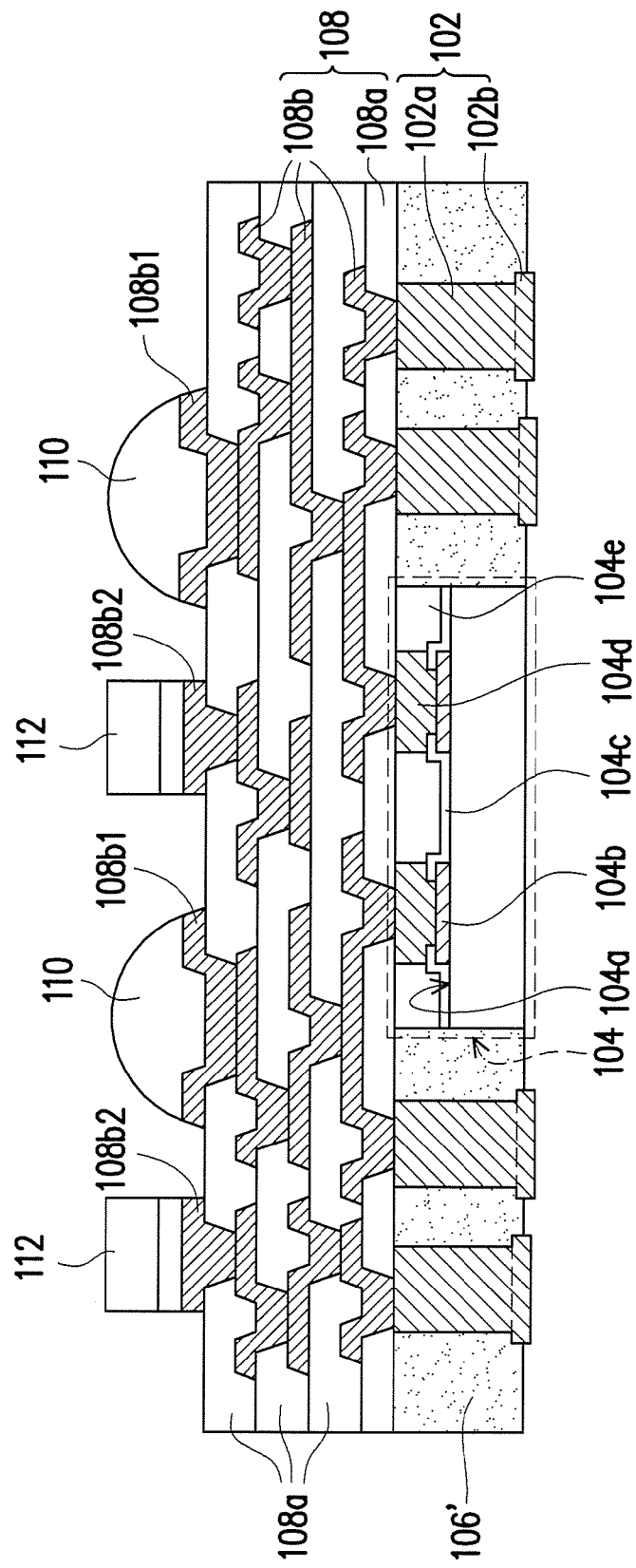

FIGS. 1 through 7 and FIGS. 12 through 13 illustrate another process flow for fabricating an integrated fan-out package in accordance with some embodiments. Referring to FIG. 12, after the conductive terminals 110 and the passive components 112 are mounted on the redistribution circuit structure 108 (shown in FIG. 7), the adhesive AD formed on the bottom surface of the insulating encapsulation 106' is de-bonded from the de-bonding layer DB such the adhesive AD is separated from the carrier C. In some embodiments, the de-bonding layer DB (e.g., the LTHC release layer) may be irradiated by an UV laser such that the adhesive AD adhered on the bottom surface of the insulating encapsulation 106' is peeled from the carrier C. As shown in FIG. 12, the adhesive AD is then entirely removed such that the second portions 102b of the conductive posts 102 and the insulating encapsulation 106' are exposed. In some embodiments, the adhesive AD is removed by a laser lift-off process.

Figure 13:
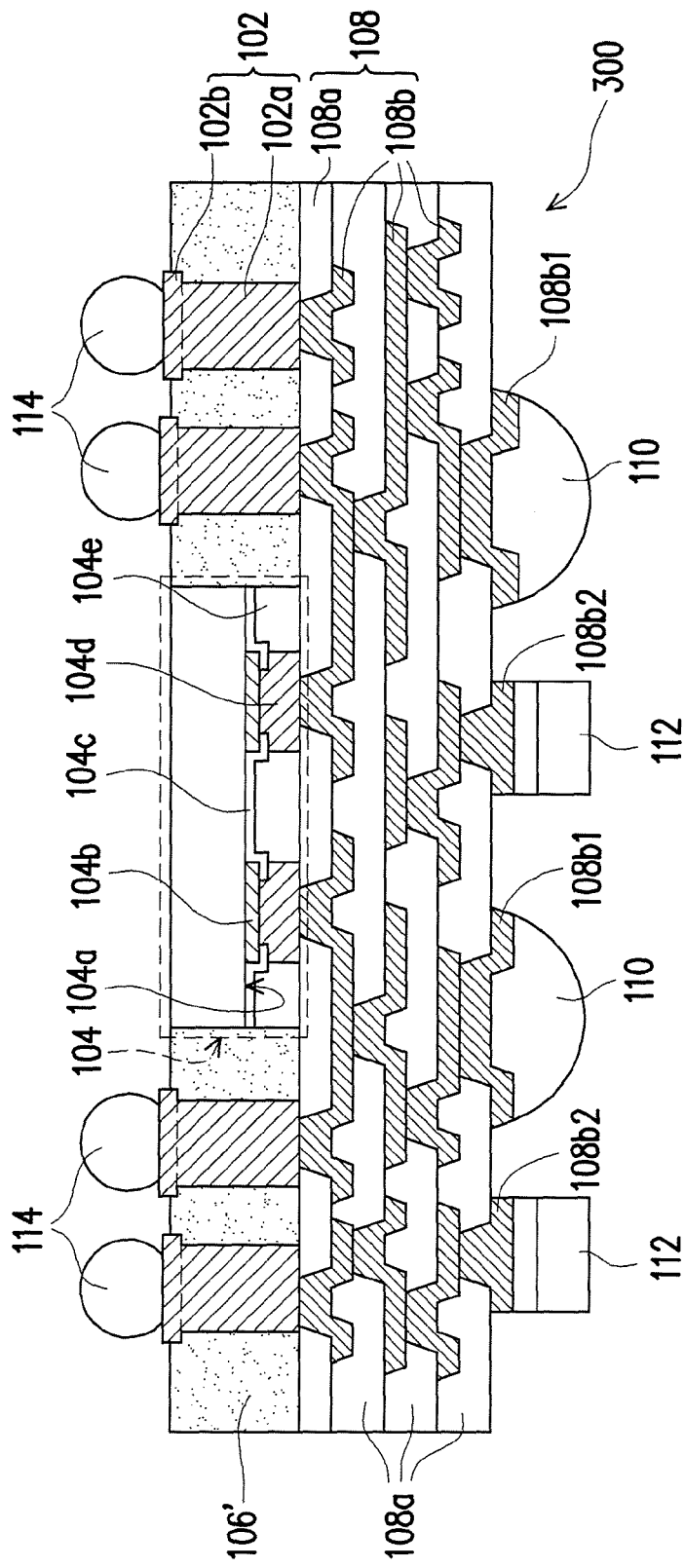

Referring to FIG. 13, after the adhesive AD is removed, a plurality of conductive terminals 114 are placed on and electrically connected to the second portions 102b of the conductive posts 102. As shown in FIG. 13, after the conductive terminals 110 and the conductive terminals 114 are formed, an integrated fan-out package 300 having dual-side terminal design is accomplished.

Figure 14:
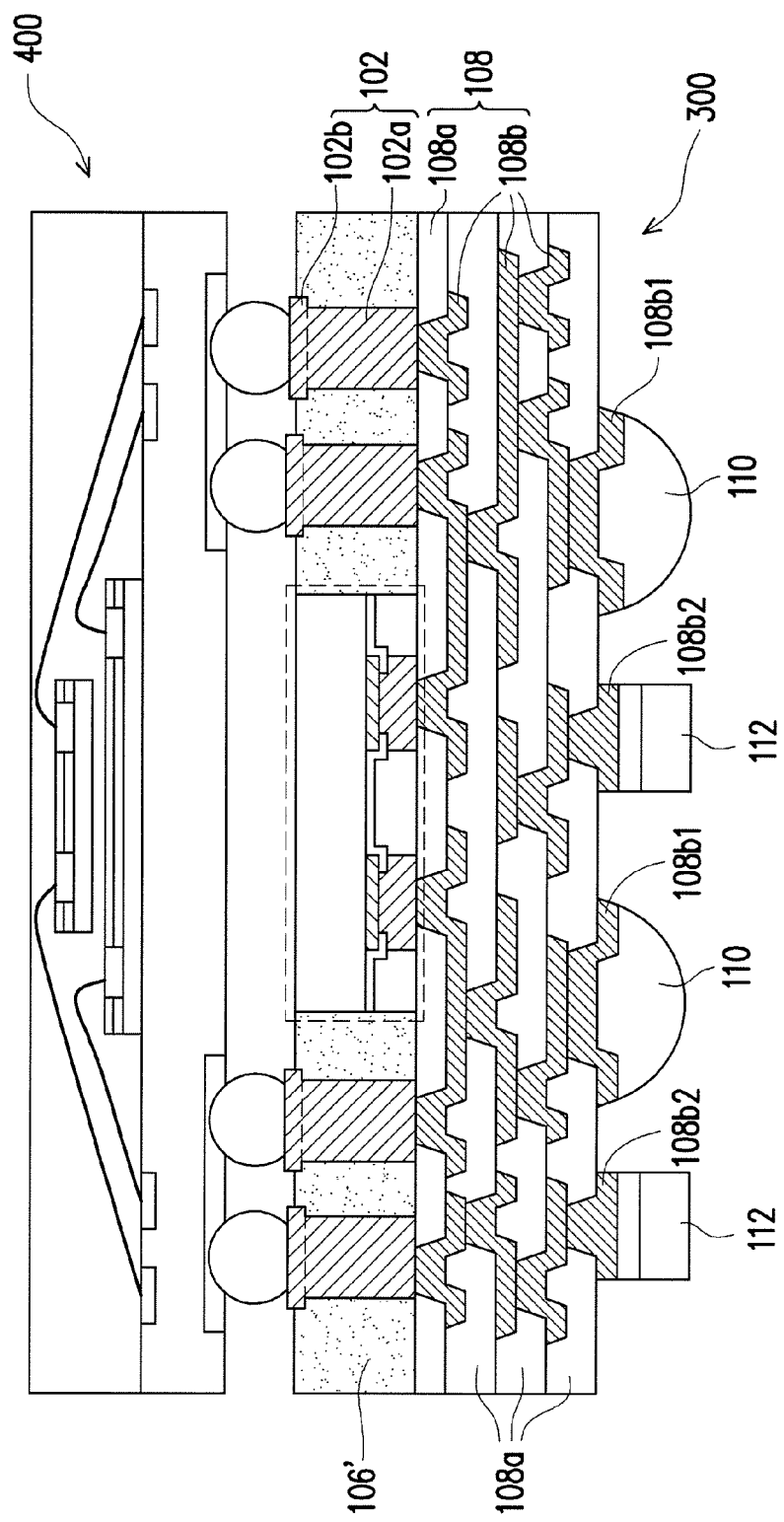
FIG. 14 is across-sectional view illustrating another package-on-package (POP) in accordance with some embodiments.

FIG. 14 is across-sectional view illustrating another package-on-package (POP) in accordance with some embodiments. Referring to FIG. 13 and FIG. 14, another package 400 is then provided. In some embodiments, the package 400 is, for example, a memory device or other IC packages. The package 400 is stacked over and is electrically connected to the integrated fan-out package 500 illustrated in FIG. 13 through the conductive balls 114 such that a package-on-package (POP) structure is fabricated.

Figure 15C:
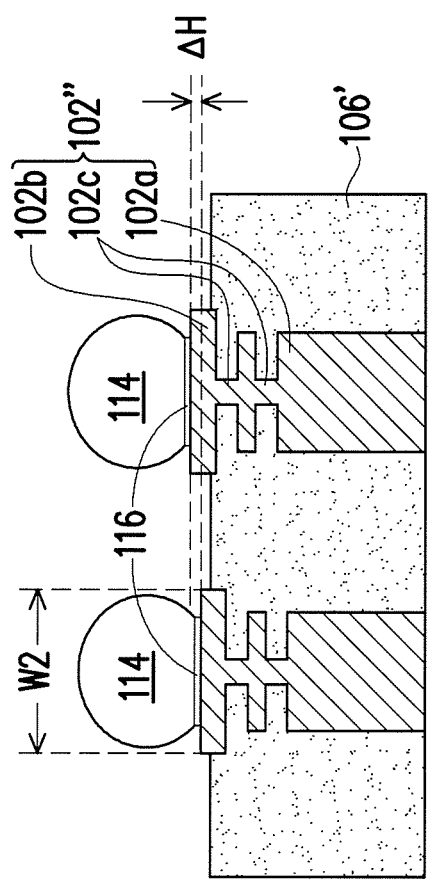

FIGS. 15A through 15B are cross-sectional views illustrating different conductive posts in accordance with some alternative embodiments. Referring to FIGS. 15A through 15C, Referring to FIG. 13 and FIG. 15A, in the integrated fan-out package 200 illustrated in FIG. 13, the second portions 102b of the conductive posts 102 and the conductive terminals 114 may be made from the same material or made from different materials. In some embodiments, the second portions 102b of the conductive posts 102 and the conductive terminals 114 are made from the same material, a plurality of interfaces located at different level/heights are formed between the conductive posts 102 and the conductive terminals 114, and the level (height) variation ΔH between the interfaces of the conductive posts 102 and the conductive terminals 114 is greater than 1 micrometer and less than 10 micrometers, for example. In some alternative embodiments, the second portions 102b of the conductive posts 102 and the conductive terminals 114 are made from different materials, a plurality of intermetallic compound layers 116 located at different level/heights are formed between the conductive posts 102 and the conductive terminals 114, and the level (height) variation ΔH of the intermetallic compound layers 116 between the conductive posts 102 and the conductive terminals 114 is greater than 1 micrometer and less than 10 micrometers, for example.

Referring to FIG. 15B, the conductive posts 102 shown in FIG. 15A may be modified into the conductive posts 102' according to design requirements. As shown in FIG. 15B, each of the conductive posts 102' includes a first portion 102a, a second portion 102a, and a necking portion 102c which is connected between the first portion 102a and the second portion 102b. The width W3 of the necking portion 102c is less than the width W1 of the first portion 102a and the width W2 of the second portion 102b. The first portions 102a and the necking portions 102c of the conductive posts 102' are embedded in and encapsulated by the insulating encapsulation 106'. The necking portions 102c of the conductive posts 102' enhance the adhesion between the conductive posts 102' and the insulating encapsulation 106'.

Referring to FIG. 15C, the conductive posts 102 shown in FIG. 15A may be modified into the conductive posts 102" according to design requirements. As shown in FIG. 15C, each of the conductive posts 102" includes a first portion 102a, a second portion 102a, and two necking portions 102c which is connected between the first portion 102a and the second portion 102b. The necking portions 102c of the same conductive post 102 are connected to each other. The width W3 of the necking portion 102c is less than the width W1 of the first portion 102a and the width W2 of the second portion 102b. The necking portions 102c of the conductive posts 102" are embedded in and encapsulated by the insulating encapsulation 106'. The necking portions 102c of the conductive posts 102' may enhance the adhesion between the conductive posts 102" and the insulating encapsulation 106'.

Since the above-mentioned conductive posts 102, 102', and 102" with a predetermined aspect ratio are fabricated before they are transfer-bonded onto the adhesive AD, the fabrication of the conductive posts 102, 102', and 102" is not restricted by the packaging process. Furthermore, the fabrication costs and the fabrication cycle time of the conductive posts 102, 102', and 102" are reduced, since the conductive posts 102, 102', and 102" are not fabricated by sputtering, photolithography, plating, and photoresist stripping processes.

In accordance with some embodiments of the present disclosure, a method for fabricating an integrated fan-out package is provided. The method includes the following steps. A plurality of conductive posts are placed in apertures of a substrate. A carrier having an adhesive thereon is provided. The conductive posts are transferred to the carrier in a standing orientation by adhering the conductive posts in the apertures to the adhesive. An integrated circuit component is mounted onto the adhesive having the conductive posts adhered thereon. An insulating encapsulation is formed to encapsulate the integrated circuit component and the conductive posts. A redistribution circuit structure is formed on the insulating encapsulation, the integrated circuit component, and the conductive posts, wherein the redistribution circuit structure is electrically connected to the integrated circuit component and the conductive posts. The carrier is removed. At least parts of the adhesive are removed (e.g. patterned or entirely removed) to expose surfaces of the conductive posts. A plurality of conductive terminals is formed on the exposed surfaces of the conductive posts.

In accordance with alternative embodiments of the present disclosure, an integrated fan-out package including a plurality of conductive posts, an integrated circuit component, an insulating encapsulation, a redistribution circuit structure, and a plurality of conductive terminals is provided. The insulating encapsulation encapsulates the integrated circuit component and the conductive posts. The redistribution circuit structure is disposed on the insulating encapsulation, the integrated circuit component, and the conductive posts. The redistribution circuit structure is electrically connected to the integrated circuit component and the conductive posts. The conductive terminals are electrically connected to the conductive posts, wherein a level (height) variation between interfaces of the conductive posts and the conductive terminals is greater than 1 micrometer and less than 10 micrometers.

In accordance with yet alternative embodiments of the present disclosure, another integrated fan-out package including a plurality of conductive posts, an integrated circuit component, an insulating encapsulation, a redistribution circuit structure, and a plurality of conductive terminals is provided. The insulating encapsulation encapsulates the integrated circuit component and the conductive posts. The redistribution circuit structure is disposed on the insulating encapsulation, the integrated circuit component, and the conductive posts. The redistribution circuit structure is electrically connected to the integrated circuit component and the conductive posts. The conductive terminals are electrically connected to the conductive posts, wherein a plurality of intermetallic compound layers are formed between the conductive posts and the conductive terminals, and a level (height) variation of the intermetallic compound layers formed between the conductive posts and the conductive terminals is greater than 1 micrometer and less than 10 micrometers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated fan-out package, comprising:
    placing a plurality of conductive posts in respective apertures of a substrate;
    providing a carrier having an adhesive thereon;
    transferring the plurality of conductive posts to the carrier in a standing orientation by adhering the plurality of conductive posts in the respective apertures to the adhesive;
    mounting an integrated circuit component onto the adhesive having the plurality of conductive posts adhered thereon;
    forming an insulating encapsulation to encapsulate the integrated circuit component and the plurality of conductive posts;
    forming a redistribution circuit structure on the insulating encapsulation, the integrated circuit component, and the plurality of conductive posts, and the redistribution circuit structure being electrically connected to the integrated circuit component and the plurality of conductive posts;
    removing the carrier;
    removing at least parts of the adhesive to expose surfaces of the plurality of conductive posts; and
    forming a plurality of conductive terminals on the exposed surfaces of the plurality of conductive posts.

2. The method of claim 1, wherein each of the plurality of conductive posts comprises a first portion embedded in the insulating encapsulation and a second portion connected to the first portion, a width of the first portion is less than a width of the apertures, and a width of the second portion is greater than the width of the apertures.

3. The method of claim 2, wherein each of the plurality of conductive posts further comprises a necking portion connected between the first portion and the second portion, and a width of the necking portion is less than the width of the first portion and the width of the second portion.

4. The method of claim 3, wherein the first portions and the necking portions are encapsulated by the insulating encapsulation, and the second portions are partially exposed by the insulating encapsulation.

5. The method of claim 1, wherein the adhesive is patterned to form a patterned adhesive having a plurality of openings for exposing surfaces of the plurality of conductive posts before forming the plurality of conductive terminals.

6. The method of claim 1, wherein the adhesive is removed entirely before forming the plurality of conductive terminals.

7. The method of claim 1, wherein the plurality of conductive posts and the plurality of conductive terminals are made from different materials, a plurality of intermetallic compound layers are formed between the plurality of conductive posts and the plurality of conductive terminals, and a level variation of the plurality of intermetallic compound layers as seen in a cross-sectional view is greater than 1 micrometer and less than 10 micrometers.

8. The method of claim 1, wherein the plurality of conductive posts and the plurality of conductive terminals are made from a same material, and a level variation between respective interfaces of the conductive posts and the plurality of conductive terminals as seen in a cross-sectional view is greater than 1 micrometer and less than 10 micrometers.

9. A method for fabricating an chip package, comprising:
    transferring a plurality of conductive posts placed in respective apertures of a substrate to an adhesive formed on a carrier in a standing orientation;
    disposing an integrated circuit component onto the adhesive having the plurality of conductive posts disposed thereon;
    encapsulating the integrated circuit component and the plurality of conductive posts with an insulating encapsulation;
    forming a redistribution circuit structure electrically connected to the integrated circuit component and the plurality of conductive posts on the insulating encapsulation, the integrated circuit component and the plurality of conductive posts; and
    removing the carrier.

10. The method of claim 9, wherein each of the plurality of conductive posts comprises a first portion at least partially embedded in the insulating encapsulation and a second portion connected to the first portion, a width of the first portion is less than a width of the respective apertures, and a width of the second portion is greater than the width of the respective apertures.

11. The method of claim 10, wherein each of the plurality of conductive posts further comprises a necking portion connected between the first portion and the second portion, and a width of the necking portion is less than the width of the first portion and the width of the second portion.

12. The method of claim 11, wherein the first portions and the necking portions are encapsulated by the insulating encapsulation, and the second portions are partially exposed by the insulating encapsulation.

13. The method of claim 9 further comprising:
removing at least parts of the adhesive to expose respective surfaces of the plurality of conductive posts after removing the carrier; and
forming a plurality of conductive terminals on the respective exposed surfaces of the plurality of conductive posts.

14. The method of claim 13, wherein the adhesive is patterned to form a patterned adhesive having a plurality of openings for exposing respective surfaces of the plurality of conductive posts before forming the conductive terminals.

15. The method of claim 13, wherein the adhesive is removed entirely before forming the conductive terminals.

16. The method of claim 13, wherein the plurality of conductive posts and the plurality of conductive terminals are made from different materials, a plurality of intermetallic compound layers are formed between the respective conductive posts and the conductive terminals, and a level variation of the plurality of intermetallic compound layers as seen in a cross-sectional view is greater than 1 micrometer and less than 10 micrometers.

17. The method of claim 13, wherein the plurality of conductive posts and the plurality of conductive terminals are made from a same material, and a level variation between respective interfaces of the conductive posts and the conductive terminals as seen in a cross-sectional view is greater than 1 micrometer and less than 10 micrometers.

18. A method for fabricating an chip package, comprising:
placing a plurality of conductive posts in respective apertures of a substrate;
providing a carrier having an adhesive thereon;
adhering the adhesive with the plurality of conductive posts placed in respective apertures of a substrate;
pulling out the plurality of conductive posts from the respective apertures of the substrate, wherein the plurality of conductive posts are adhered on the adhesive in a standing orientation;
disposing an integrated circuit component onto the adhesive having the plurality of conductive posts disposed thereon;
forming an insulating encapsulation to encapsulate the integrated circuit component and the plurality of conductive posts;
forming a redistribution circuit structure on the insulating encapsulation, the integrated circuit component, and the plurality of conductive posts, and the redistribution circuit structure being electrically connected to the integrated circuit component and the plurality of conductive posts; and
removing the carrier.

19. The method of claim 18, wherein the plurality of conductive posts are pulled out from the respective apertures of the substrate through a movement of the carrier.

20. The method of claim 18 further comprising:
removing at least parts of the adhesive to expose surfaces of the plurality of conductive posts after removing the carrier; and
forming a plurality of conductive terminals on the respective exposed surfaces of the plurality of conductive posts.

* * * * *